(12) United States Patent
Kull et al.

(10) Patent No.: US 12,253,137 B2
(45) Date of Patent: Mar. 18, 2025

(54) DAMPING APPARATUS AND METHOD OF USING SAME

(71) Applicant: Stabilus GmbH, Koblenz (DE)

(72) Inventors: James T. Kull, Denver, NC (US); Todd A. Greve, Myrtle Beach, SC (US); Rahul Chandrashekar, Farmington, MI (US); Christopher Niemiec, Livonia, MI (US)

(73) Assignee: Stabilus GmbH, Koblenz (DE)

( * ) Notice: Subject to any disclaimer, the term of this patent is extended or adjusted under 35 U.S.C. 154(b) by 0 days.

(21) Appl. No.: 18/135,167

(22) Filed: Apr. 16, 2023

(65) Prior Publication Data
US 2023/0358289 A1 Nov. 9, 2023

Related U.S. Application Data

(63) Continuation of application No. PCT/US2021/055443, filed on Oct. 18, 2021, which
(Continued)

(51) Int. Cl.
*F16F 1/12* (2006.01)
*F16F 9/18* (2006.01)
(Continued)

(52) U.S. Cl.
CPC .............. *F16F 9/18* (2013.01); *F16F 9/3292* (2013.01); *F16F 9/34* (2013.01); *H02S 20/32* (2014.12);
(Continued)

(58) Field of Classification Search
CPC ........ F16F 9/18; F16F 9/34–46; F16F 9/3292; F16F 2222/12; F16F 2230/08; F16F 2230/18; H02S 20/32
(Continued)

(56) References Cited

U.S. PATENT DOCUMENTS 2,316,924 A 11/1941 Whisler, Jr.
2,756,071 A 7/1956 Riva
(Continued)

FOREIGN PATENT DOCUMENTS

EP 1826455 A2 8/2007
FR 1419551 12/1965
WO WO2015077628 A1 5/2015

OTHER PUBLICATIONS

European Patent Office. English translation of foreign patent document FR1419551A. Apr. 13, 2021.
(Continued)

*Primary Examiner* — Christopher P Schwartz
(74) *Attorney, Agent, or Firm* — ASHLEY LAW FIRM P.C.; Stephen S. Ashley, Jr.

(57) ABSTRACT

A damping apparatus for use with a solar panel array and a solar tracking device that is operatively connected to the solar panel array to control positioning of solar panels. The damping apparatus can absorb kinetic energy from movement of the solar panels and convert the kinetic energy to heat energy. The damping apparatus can include one or more sensors that collect data corresponding to the heat energy. The damping apparatus can send instructions to the solar tracking device for adjusting the position of the solar panels based on the analysis of the sensor data.

18 Claims, 9 Drawing Sheets

Related U.S. Application Data is a continuation-in-part of application No. 16/778,028, filed on Jan. 31, 2020, now Pat. No. 11,156,262.

(60) Provisional application No. 63/092,693, filed on Oct. 16, 2020, provisional application No. 62/800,147, filed on Feb. 1, 2019, provisional application No. 62/800,217, filed on Feb. 1, 2019, provisional application No. 62/862,760, filed on Jun. 18, 2019.

(51) Int. Cl.
  *F16F 9/32* (2006.01)
  *F16F 9/34* (2006.01)
  *H02S 20/32* (2014.01)

(52) U.S. Cl.
  CPC ....... *F16F 2222/12* (2013.01); *F16F 2230/08* (2013.01); *F16F 2230/18* (2013.01); *F16F 2232/08* (2013.01)

(58) Field of Classification Search
  USPC ..... 188/266.1–266.5, 267.1, 267.2, 276, 277
  See application file for complete search history.

(56) References Cited

U.S. PATENT DOCUMENTS

| | | | |
|---|---|---|---|
| 4,340,812 A | 7/1982 | Mori | |
| 4,632,228 A | 12/1986 | Oster et al. | |
| 4,638,896 A * | 1/1987 | Poyser | F16F 9/464 251/129.16 |
| 4,667,780 A | 5/1987 | Pauliukonis | |
| 4,895,229 A | 1/1990 | Kato | |
| 4,943,083 A * | 7/1990 | Groves | F16F 9/463 280/5.515 |
| 4,991,675 A | 2/1991 | Tosconi et al. | |
| 5,000,478 A * | 3/1991 | Kerastas | B60G 17/01933 188/266.7 |
| 5,095,581 A | 3/1992 | Sarto | |
| 5,450,933 A | 9/1995 | Schuttler | |
| 5,501,438 A | 3/1996 | Handke et al. | |
| 5,799,759 A | 9/1998 | Koch | |
| 5,855,363 A | 1/1999 | Svendsen | |
| 5,896,959 A | 4/1999 | Jeffries et al. | |
| 6,089,966 A | 8/2000 | Latvis, Jr. et al. | |
| 6,179,100 B1 | 1/2001 | Mintgen et al. | |
| 6,296,091 B1 * | 10/2001 | Hamilton | B60G 17/018 251/52 |
| 6,328,291 B1 | 12/2001 | Marzocchi et al. | |
| 6,460,839 B2 | 10/2002 | Muller | |
| 6,491,292 B2 | 12/2002 | Stumm et al. | |
| 6,883,650 B2 | 4/2005 | Van Wonderen et al. | |
| 6,935,626 B2 | 8/2005 | Champ | |
| 6,942,204 B2 | 9/2005 | Wolf et al. | |
| 6,978,985 B2 | 12/2005 | Lung et al. | |
| 7,066,455 B2 | 6/2006 | Adoline et al. | |
| 7,156,214 B2 | 1/2007 | Pradel et al. | |
| 7,425,188 B2 | 9/2008 | Ercanbrack et al. | |
| 7,510,175 B2 | 3/2009 | Chiu | |
| 7,631,922 B2 | 12/2009 | Armstrong et al. | |
| 7,975,994 B2 | 7/2011 | Born et al. | |
| 7,993,070 B2 | 8/2011 | Kull et al. | |
| 8,146,417 B2 | 4/2012 | Glasson et al. | |
| 8,459,249 B2 | 6/2013 | Corio | |
| 8,627,933 B2 | 1/2014 | Six et al. | |
| 8,714,531 B2 | 5/2014 | Roma | |
| 8,899,560 B2 | 12/2014 | Allen et al. | |
| 9,057,546 B2 | 6/2015 | Sade | |
| 9,206,873 B2 | 12/2015 | Kull et al. | |
| 9,598,889 B2 | 3/2017 | Lohken et al. | |
| 9,829,034 B2 | 11/2017 | Armstrong et al. | |
| 9,917,546 B2 | 3/2018 | Sade | |
| 9,985,154 B2 | 5/2018 | Needham et al. | |
| 9,995,506 B2 | 6/2018 | Doyle | |
| 10,221,915 B2 | 3/2019 | Kull et al. | |
| 10,648,528 B2 | 5/2020 | Kull et al. | |
| 10,848,097 B1 | 11/2020 | Needham et al. | |
| 10,903,782 B2 | 1/2021 | Needham et al. | |
| 11,118,941 B2 | 9/2021 | Ehre | |
| 11,156,262 B2 * | 10/2021 | Chandrashekar | G08B 25/10 |
| 11,209,337 B1 | 12/2021 | Needham et al. | |
| 11,416,010 B2 | 8/2022 | Needham et al. | |
| 11,422,575 B2 | 8/2022 | Needham et al. | |
| 11,566,692 B2 * | 1/2023 | Worden | F16H 25/20 |
| 12,135,067 B2 * | 11/2024 | Kull | F16M 13/022 |
| 2003/0107028 A1 | 6/2003 | Martin | |
| 2003/0197502 A1 | 10/2003 | Nyce et al. | |
| 2004/0113341 A1 | 6/2004 | McConnell et al. | |
| 2007/0068753 A1 | 3/2007 | Schmidt | |
| 2009/0271998 A1 | 11/2009 | Carlen et al. | |
| 2011/0278778 A1 | 11/2011 | Qattan | |
| 2011/0308512 A1 * | 12/2011 | Nakasato | F24S 50/20 126/694 |
| 2013/0048048 A1 * | 2/2013 | Flanery | F24S 40/20 136/246 |
| 2013/0206524 A1 | 8/2013 | Bohrer et al. | |
| 2014/0077429 A1 | 3/2014 | Battery et al. | |
| 2014/0260233 A1 * | 9/2014 | Giovanardi | F15B 13/0444 60/431 |
| 2014/0338659 A1 | 11/2014 | Corio | |
| 2015/0107583 A1 | 4/2015 | Doyle | |
| 2018/0037251 A1 | 2/2018 | Nelson | |
| 2018/0302027 A1 | 10/2018 | Betts et al. | |
| 2019/0072150 A1 | 3/2019 | Kull et al. | |
| 2020/0064223 A1 * | 2/2020 | Ehre | G01L 5/0071 |
| 2020/0248773 A1 | 8/2020 | Chandrashekar et al. | |
| 2020/0300325 A1 * | 9/2020 | Vine | G05D 15/01 |
| 2021/0277973 A1 | 9/2021 | Kull et al. | |
| 2022/0342429 A1 * | 10/2022 | Needham | H02S 20/32 |
| 2023/0137900 A1 | 5/2023 | Kull et al. | |

OTHER PUBLICATIONS

International Search Report for Internaional application No. PCT/US2021/055443, Jan. 27, 2022.

* cited by examiner

| Current State | Delta T Input | Next State |
| --- | --- | --- |
| S0 | Increase delta T | S1 |
| | No Change delta T | S3 |
| | Decrease delta T | S2 |
| S1 | Increase delta T | S1 |
| | No Change delta T | S3 |
| | Decrease delta T | S2 |
| S2 | Increase delta T | S1 |
| | No Change delta T | S3 |
| | Decrease delta T | S2 |
| S3 | Increase delta T | S1 |
| | No Change delta T | S3 |
| | Decrease delta T | S2 |

DAMPING APPARATUS AND METHOD OF USING SAME

CROSS REFERENCE TO RELATED APPLICATIONS

This application is a continuation of International Application No. PCT/US2021/055443, filed Oct. 18, 2021, which claims priority to U.S. Provisional Patent Application No. 63/092,693, filed Oct. 16, 2020. Also, International Application No. PCT/US2021/055443 is a continuation-in-part of U.S. patent application Ser. No. 16/778,028, filed Jan. 31, 2020, now U.S. Pat. No. 11,156,262, which claims priority to U.S. Provisional Patent Application No. 62/800,147, filed Feb. 1, 2019, U.S. Provisional Patent Application No. 62/800,217, filed Feb. 1, 2019, and U.S. Provisional Patent Application No. 62/862,760, filed Jun. 18, 2019. All of said applications are incorporated by reference herein.

TECHNICAL FIELD

The present invention relates to the mechanical arts. An embodiment of the invention comprises a damping apparatus for use with solar panel arrays. U.S. Pat. Nos. 10,648,528, 8,568,026 and 4,018,624, U.S. Patent Application Publication No. 2020/0248773, and International Publication No. WO2020/018532A1 are incorporated by reference herein.

BACKGROUND

Solar energy can be harvested and converted to electric energy through the use of solar panel devices. Panels containing photovoltaic and/or photoelectric cells can be attached to a rotating structure to form an array of solar panels configured to follow the sun. Solar tracking devices can rotate an array of panels to maintain alignment with the sun over the course of a day to maximize energy collection from the sun. U.S. Pat. No. 9,995,506, which is incorporated herein by reference, describes a system for solar tracking for solar array systems.

The solar panels can be attached to a rotating beam and rotated with a motor. The length of the beam allows it to have torsional properties. The panels can catch wind and cause a deflection in the attaching beam. The various speeds of the wind (wind buffeting) can start a harmonic motion in the structure causing detrimental loads. A damping apparatus, such as a damping apparatus disclosed in U.S. Patent Application Publication No. 2021/0277973, which is incorporated herein by reference, can be used with a solar array to dissipate the energy by converting the energy into heat. U.S. Patent Application Publication No. 2019/0072150 describes systems and methods for damping photovoltaic panel arrays and is incorporated herein by reference.

SUMMARY

One object of the present invention is to provide a damping apparatus for use with a solar panel array. Another object of the invention is to provide a damping apparatus that can monitor temperature, weather conditions, velocity, acceleration, solar panel angle/position and/or energy absorption of the damper. These and other objects of the invention can be achieved in one or more embodiments of the invention disclosed herein.

One embodiment of the invention comprises a damping apparatus adapted for use with a solar panel array.

Another embodiment of the invention comprises a damping apparatus comprising means for monitoring temperature and/or energy absorption of the damper. According to an embodiment, the means for monitoring temperature can comprise one or more thermocouples.

According to an embodiment of the invention, the damping apparatus comprises a piston rod and means for sensing the position of the rod in the damping apparatus. According to an embodiment, the apparatus comprises at least one position sensor such as a linear encoder, a string potentiometer, a linear variable displacement transducer (LVDT), microelectromechanical (MEM) sensor, a magnetorestrictive device, and/or a hall effect sensor.

Another embodiment of the invention comprises a damping apparatus comprising means for assessing the mechanical health and remaining life of the damping apparatus. According to an embodiment of the invention, a damping apparatus comprises means for detecting problems in the damping apparatus and communicating the problems to operators. The apparatus can be operatively connected to a smart phone and/or smart watch, and can send email, text (SMS) messages, and/or other forms of communication.

An embodiment of the invention comprises a damping apparatus that absorbs kinetic energy from movement of a moveable object, converts the kinetic energy to heat energy, collects data regarding the converted heat energy, analyzes the data, and provides instructions relating to the operation of the moveable object to maximize performance of the moveable object.

An embodiment of the invention comprises a damping apparatus that absorbs kinetic energy from movement of a moveable object, converts the kinetic energy to heat energy, collects data regarding the converted heat energy, analyzes the data, and provides instructions relating to the operation of the moveable object to maximize performance of the moveable object.

Another embodiment of the invention comprises a damping apparatus adapted for use with a solar panel array, wherein the damping apparatus absorbs kinetic energy from movement of panels of the solar array, converts the kinetic energy to heat energy, collects data regarding the converted heat energy, analyzes the data, and provides instructions to the solar array controller for making adjustments to the solar array based on the data analysis to maximize performance of the solar array.

Another embodiment of the invention comprises a method for operating a solar panel array comprising operatively connecting a damping apparatus to at least one solar panel of the solar panel array. The damping apparatus absorbs kinetic energy from movement of the solar panel and converts the kinetic energy to heat energy. Data regarding the converted heat energy is collected and analyzed, and adjustments to the operation of the solar array are made based on the data analysis.

According to an embodiment of the invention, a damping apparatus comprises means for measuring temperature in the shock absorber and the data can be transferred to an operator using wired/wireless communication.

According to another embodiment, a damping apparatus comprises means for measuring velocity in the shock absorber and the data can be transferred to the operator using wired or wireless communication.

Another embodiment of the invention comprises a damping apparatus that monitors and collects data regarding acceleration of the piston rod. According to an embodiment, the damping apparatus comprises an accelerometer.

According to an embodiment of the invention, a pattern analysis is performed based on the temperature sensor fusion information to predict failures and faults.

According to another embodiment of the invention, the history of all parameters is recorded, which leads to detection of shock absorber deterioration using algorithms.

According to another embodiment of the invention, machine learning is performed on the real time data to identify anomalies, outliers and predict failure of the shock absorber.

According to another embodiment of the invention, a damping apparatus comprises at least one battery or energy harvester powered sensor, and means for collecting information on the battery status within the sensor and notifying an operator when the battery needs replacement.

Another embodiment of the invention comprises a damping apparatus for use with a solar panel and a solar tracking device operatively connected to the solar panel to control positioning of the solar panel. The damping apparatus is adapted to absorb kinetic energy from movement of the solar panel and convert the kinetic energy to heat energy, the damping apparatus comprising means for measuring the heat energy, collecting data relating to the measuring of the heat energy, analyzing the data, and sending instructions to the solar tracking device for adjusting the position of the solar panel based on the analysis of the data.

According to an embodiment of the invention, the damping apparatus takes an initial measurement of the heat energy and at least one subsequent measurement of the heat energy after a predetermined amount of time. A delta temperature value can be determined by subtracting the initial measurement of heat energy from the at least one subsequent measurement of the heat energy. Instructions to the solar tracking device for adjusting the position of the solar panel are based on analysis of the delta temperature value.

According to an embodiment of the invention, if the delta temperature value is an increase of greater than five degrees Celsius per minute and less than or equal to twenty degrees Celsius per minute, then the damping apparatus provides instructions to the solar tracking device to move the panels incrementally to an optimal position to reduce wind harmonics on the solar panel and maximize solar energy harvesting. If the delta temperature value is an increase of greater than twenty degrees Celsius per minute, then the damping apparatus instructs the solar tracking device to move the solar panel to a stow position.

According to an embodiment of the invention, the damping apparatus includes a computing device comprising a computer processor and a non-transitory computer readable storage medium comprising software comprising programming instructions that, when executed, cause the processor to analyze the data and send instructions to the solar tracking device for adjusting the position of the solar panel based on the analysis of the data.

Another embodiment of the invention comprises a damping apparatus comprising a housing defining an interior area, the housing having an interior surface and an exterior surface, and a first end and a second end opposite the first end, and a piston rod partially positioned within the interior area of the housing, the piston rod having first and second opposed ends. The first end of the piston rod is exterior to the housing and the second end of the piston rod is within the interior area of the housing. The first end of the housing has an opening formed therein for receiving the piston rod therethrough. The piston rod is adapted for moving in an extension stroke in which the piston rod moves toward the first end of the housing and an extension stroke in which the piston rod moves toward the second end of the housing. A piston is positioned proximate the second end of the piston rod, and an internal temperature sensor is configured to measure temperature inside the damping apparatus.

According to an embodiment of the invention, a computing device, such as a microcontroller, can be operatively connected to a radiofrequency transmitter, and the computing device and the radiofrequency transmitter can be connected to the piston rod proximate the first end of the piston rod. The internal temperature sensor can be operatively connected to the computing device and the radiofrequency transmitter such that the radiofrequency transmitter can transmit temperature data generated by the internal temperature sensor to a receiving device.

According to an embodiment of the invention, the damping apparatus can include one or more external temperature sensors adapted to measure temperature outside the damping apparatus. The external temperature sensor(s) can be attached to the exterior surface of the housing and operatively connected to the computing device and the radiofrequency transmitter whereby the radiofrequency can transmit temperature data generated by the external temperature sensor(s) to a receiving device.

According to an embodiment of the invention, the damping apparatus can include a position sensor connected to the piston rod and adapted to generate position data regarding position of the piston rod. The position sensor can be operatively connected to the computing device and the radiofrequency transmitter such that the radiofrequency transmitter can transmit the position data generated by the position sensor to a receiving device.

According to an embodiment of the invention, the damping apparatus can include a sensor adapted to measure acceleration of the piston rod that is operatively connected to the computing device and the radiofrequency transmitter, whereby the radiofrequency transmitter can transmit acceleration data generated by the sensor to a receiving device.

According to an embodiment of the invention, the damping apparatus can include a magnetorestrictive sensor connected to the piston rod and adapted to measure displacement distance of the piston rod, and a time measuring device. The magnetorestrictive sensor and the time measuring device can be operatively connected to the computing device and the radiofrequency transmitter. The computing device can comprise a processor and a non-transitory computer readable storage medium comprising software comprising programming instructions that, when executed, cause the processor to calculate a velocity of the piston using displacement data generated by the magnetorestrictive sensor and time data generated by the time measuring device. The radiofrequency transmitter can transmit the velocity to a receiving device.

According to an embodiment of the invention, the damping apparatus can include at least one weather sensor adapted to generate data relating to at least one of wind speed and wind direction. The weather sensor can be operatively connected to the computing device and the radiofrequency transmitter whereby the radiofrequency transmitter can transmit data generated by the at least one weather sensor to a receiving device.

According to an embodiment of the invention, the piston rod is hollow, and the internal temperature sensor comprises a K-type thermocouple comprising at least one wire positioned within the interior of the piston rod and connected to a connection terminal attached to the piston rod proximate the piston.

According to an embodiment of the invention, the damping apparatus includes a computing device operatively connected to a radiofrequency transmitter. The computing device and the radiofrequency transmitter can be connected to the piston rod proximate the first end of the piston rod, and the internal thermocouple can be operatively connected to the computing device and the radiofrequency transmitter whereby the radiofrequency transmitter transmits to a receiving device temperature data generated by the internal temperature sensor. At least one wire of the K-type thermocouple can be connected to the radiofrequency transmitter.

In another embodiment of the invention, a bottom valve can be positioned within the interior area of the housing intermediate the first end of the housing and the second end of the housing. The interior area intermediate the bottom valve and the first end of the housing define a working chamber, and the interior area intermediate the bottom valve and the second end of the housing define a compensating chamber. A damping fluid medium, such as a biodegradable oil, can be disposed within the working chamber, and the bottom valve allows damping fluid in the working chamber to enter the compensating chamber when the piston rod is in a compression stroke. According to an embodiment of the invention, the internal temperature sensor can be positioned proximate the bottom valve.

Another embodiment of the invention comprises a system for harvesting solar energy comprising a solar panel array comprising at least one solar panel adapted to absorb solar energy for generating electricity, a solar tracking device operatively connected to the solar panel array and adapted to position the at least one solar panel in a plurality of positions, and a damping apparatus operatively connected to the at least one solar panel and adapted to absorb kinetic energy from movement of the solar panel(s) and convert the kinetic energy to heat energy. The damping apparatus comprises a computing device operatively connected to the solar tracking device to communicate with the solar tracking device, and means for measuring the heat energy and sending data relating to the measuring of the heat energy to the computing device. The computing device analyzes the data, and sends instructions to the solar tracking device for adjusting the position of the solar panel based on the analysis of the data.

According to an embodiment of the invention, the damping apparatus takes an initial measurement of the heat energy and at least one subsequent measurement of the heat energy after a predetermined amount of time whereby a delta temperature value is determined by subtracting the initial measurement of heat energy from the subsequent measurement of the heat energy. Instructions to the solar tracking device for adjusting the position of the solar panel are based on analysis of the delta temperature value.

According to an embodiment of the invention, the computing device comprises a network controller unit adapted to run Modbus transmission control protocol. The network controller unit can be operatively connected to a wireless internet router whereby the network controller unit communicates with the solar tracking device.

According to an embodiment of the invention, the computing device comprises a computer processor and a non-transitory computer readable storage medium comprising software comprising programming instructions that, when executed, cause the processor to analyze the data and send instructions to the solar tracking device for adjusting the position of the at least one solar panel based on the analysis of the data.

According to an embodiment of the invention, if the delta temperature value is an increase of greater than five degrees Celsius per minute and less than or equal to twenty degrees Celsius per minute, then the damping apparatus provides instructions to the solar tracking device to move the panels incrementally to an optimal position to reduce wind harmonics on the solar panel and maximize solar energy harvesting. If the delta temperature value is an increase of greater than twenty degrees Celsius per minute, then the damping apparatus instructs the solar tracking device to move the at least one solar panel to a stow position. If the delta temperature value is an increase of less than or equal to five degrees Celsius per minute, then the damping apparatus sends no instructions to the solar tracking device to move the at least one solar panel.

Another embodiment of the invention comprises a solar tracking apparatus comprising a solar panel that absorbs solar energy for generating electricity and/or heat, a rotating shaft operatively connected to the solar panel to rotate the solar panel toward a solar energy source, and a damping apparatus operatively connected to the rotating shaft. The damping apparatus can comprise one or more sensors that measure one or more environmental conditions.

Another embodiment of the invention comprises a system for harvesting solar energy comprising a solar panel array comprising at least one solar panel adapted to absorb solar energy for generating electricity, a solar tracking device comprising a rotating member operatively connected to the solar panel array whereby the solar tracking device can rotate the at least one solar panel in a plurality of positions relative to a solar energy source, and a damping apparatus operatively connected to the at least one solar panel, wherein the damping apparatus is adapted to absorb kinetic energy from movement of the at least one solar panel and convert the kinetic energy to heat energy. The damping apparatus comprises a housing defining an interior area, the housing having an interior surface and an exterior surface, and a first end and a second end opposite the first end. A hollow piston rod is partially positioned within the interior area of the housing. A first end of the piston rod is exterior to the housing and the second end of the piston rod is within the interior area of the housing. The first end of the housing has an opening for receiving the piston rod therethrough, and the piston rod moveable between an extended position and a compressed position. A piston is positioned proximate the second end of the piston rod, and an internal temperature sensor adapted to measure temperature inside the damping apparatus. The internal temperature sensor can be partially positioned within the interior of the piston rod. A computing device is operatively connected to the internal temperature sensor and the solar tracking device, wherein the computing device analyzes temperature data generated by the internal temperature sensor, and sends instructions to the solar tracking device for adjusting the position of the solar panel based on the analysis of the temperature data.

BRIEF DESCRIPTION OF THE DRAWINGS

FIG. 2A is an enlarged partial view from FIG. 2;

DETAILED DESCRIPTION OF PREFERRED EMBODIMENTS

Figure 1:
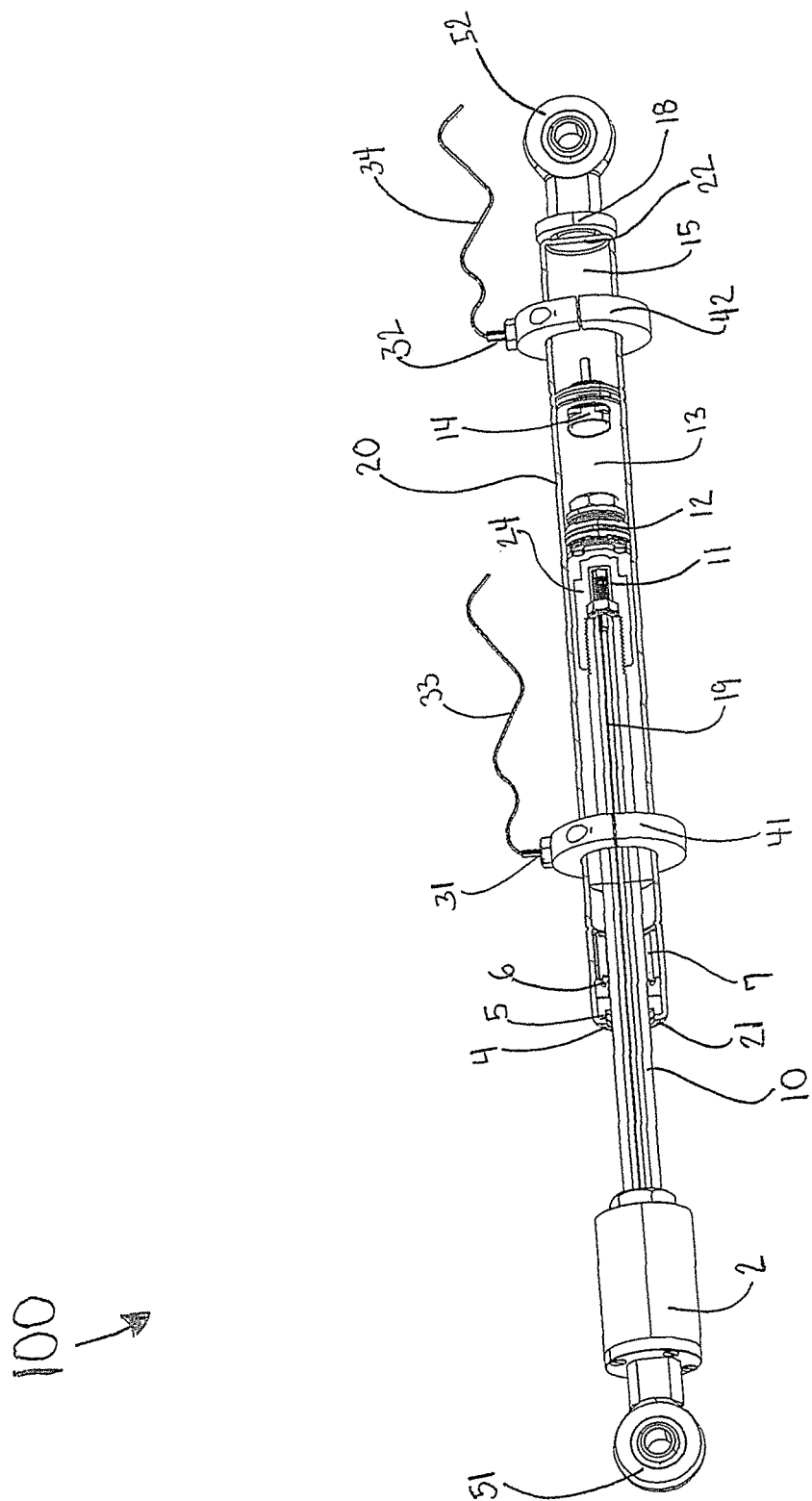
FIG. 1 is a partially cross-sectioned perspective view of a damping apparatus according to an embodiment of the invention.
Figure 2:
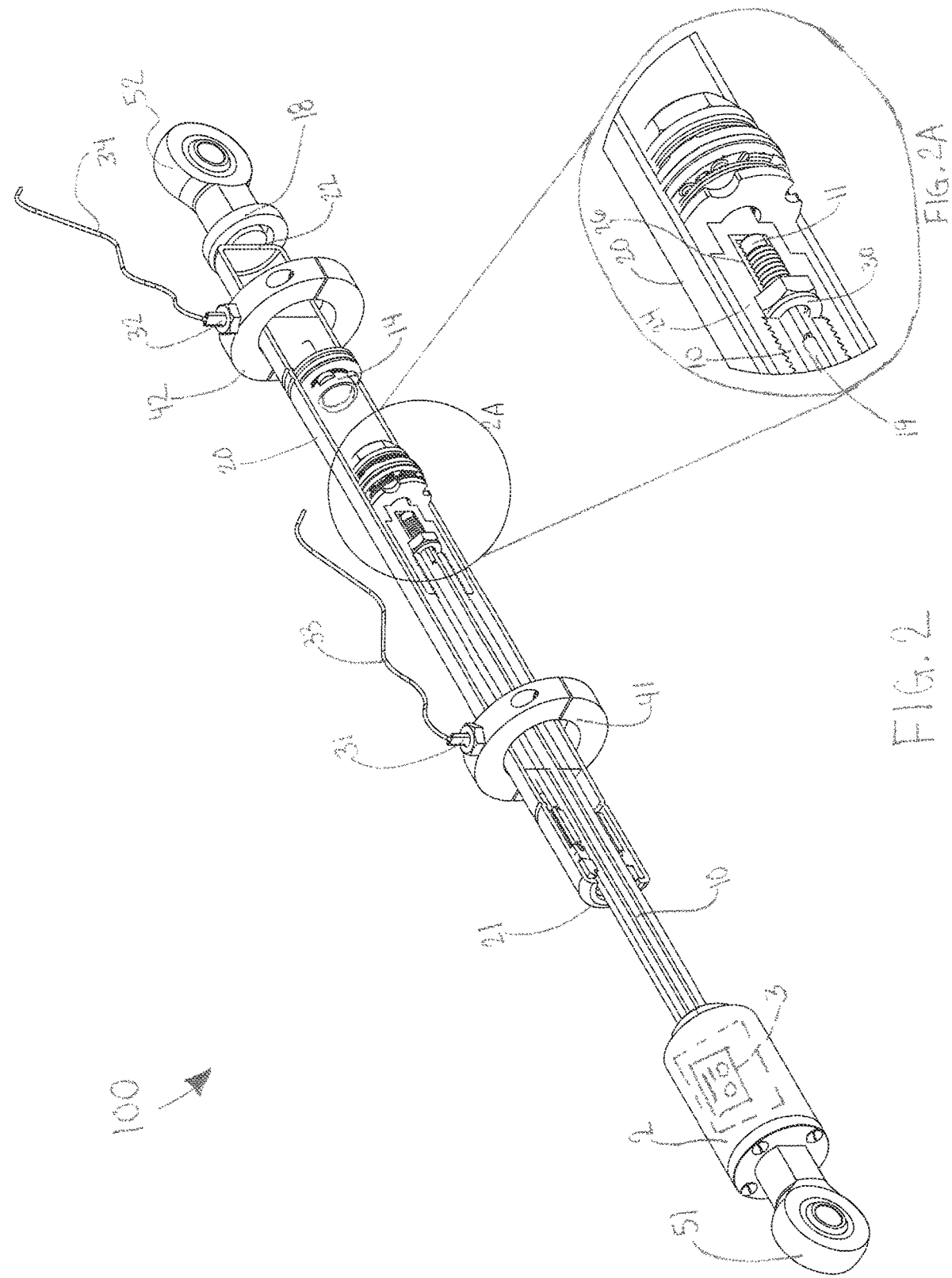
FIG. 2 is another cross-sectioned perspective view of the damping apparatus of FIG. 1.
Figure 3:
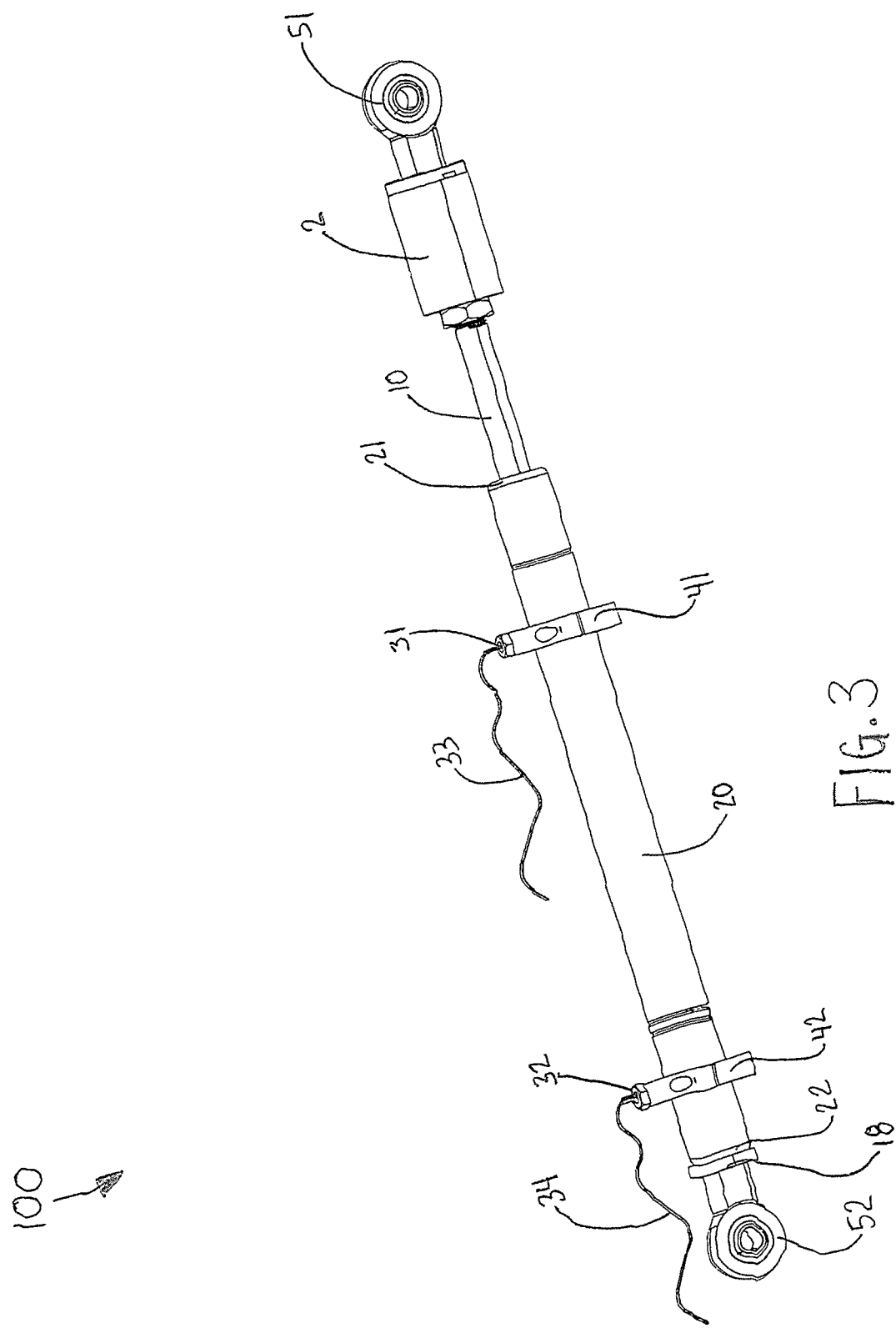
FIG. 3 is a perspective view of the of the damping apparatus of FIG. 1.

A damping apparatus according to a preferred embodiment of the invention is illustrated in FIGS. 1-3 and shown generally at reference numeral 100. The apparatus 100 comprises a piston rod 10 partially positioned within a hollow, cylindrical damper housing 20. The housing 20 can be a damper oil column having a proximal end 21 and a distal end 22. A circular opening is formed at the proximal end 21 of the damper column 20 to allow for the piston rod 10 to be inserted therethrough.

The piston rod 10 is configured for reciprocal sliding movement within the housing 20. The piston rod 10 is moveable between an extended position and a compressed position. The piston rod 10 can move in an extension stroke, in which the piston rod 10 moves toward the proximal end 21 of the housing 20 and a compression stroke in which the piston rod 10 moves toward the distal end 22.

The damping apparatus 100 can be made from any suitable materials, such as metal, plastic, ceramic and composite materials. The damping apparatus 100 can be made using any suitable technique, including but not limited to, machining. Exemplary methods for making a damper apparatus are described in U.S. Pat. No. 7,631,922, which is incorporated herein by reference.

A damper stacked washer piston 12 is positioned on the rod 10, as shown in FIGS. 1 and 2. A bottom valve 14 is positioned in the interior of the column 20, as shown in FIGS. 1 and 2. The interior area of the housing 20 from the proximal end 21 to the bottom valve 14 can define a working chamber 13, and the interior area from the bottom valve 14 to the distal end 22 of the housing 20 can define a compensating chamber 15. A damping fluid medium such as a biodegradable oil is disposed within the working chamber 13 of the damper column 20. As the rod 10 moves into the housing 20, a vacuum can be created on one side of the piston 12 in the working chamber 13, which can allow air or other contaminants to enter the housing 20. The bottom valve 14 can prevent the formation of a vacuum by allowing the damping fluid contained in the working chamber 13 to expand into the compensating chamber 15 as the rod 10 travels into the housing 20. The bottom valve 14 can also allow the damping fluid to return to the working chamber 13 from the compensating chamber 15 as the rod 10 extends out of the housing 20.

A damper rod guide 5 can be positioned in the interior of the housing 20 proximate the proximal end 21, as shown in FIG. 1. A wiper seal 4 and a main seal 6 can be positioned on opposite sides of the rod guide 5, and the guide 5 centers the rod 10 within the seals 4, 6 and the housing 20. The wiper seal 4 is disposed between the housing 20 and can have a diameter suitable to create a fluid-tight seal between the housing 20 and the rod 10. The wiper seal 4 can form a seal that helps prevent contaminants from entering the housing 20 during compression and extension of the rod 10.

The wiper seal 4 can be formed from any suitable material to provide a fluid-tight seal, such as rubber, urethane, fluoroelastomer, nylon, and/or polytetrafluoroethylene.

The damping apparatus 100 can comprise one or more temperature sensing devices, such as K-type thermocouples. The damping apparatus 100 can include an internal temperature sensor configured to measure the temperature inside the damper housing 20 and transmit the temperature data. Preferably, the internal temperature sensor is positioned proximate the piston 12, as shown at reference numeral 11 in FIG. 1. In an alternative embodiment, the internal temperature sensor 11 can be positioned proximate the bottom valve 14. In another embodiment, the damping apparatus 10 comprises a first internal temperature sensor proximate the piston 12, and a second internal temperature sensor proximate the bottom valve 14. In yet another embodiment, the damping apparatus 100 can include a third internal temperature sensor positioned proximate the main seal 6.

The internal temperature sensor can comprise a K-type hex bolt style thermocouple 11 connected to the piston rod 10 proximate the piston 12, as shown in FIGS. 1 and 2. The piston rod 10 can be hollow and the thermocouple 11 can include thermocouple wire 19 that is positioned within the rod 10, as shown in FIGS. 1, 2 and 2A. The thermocouple connection terminal 11 can be positioned in an aluminum insert 26 that is embedded in an external housing connection member 24, and the housing connection member 24 is mounted on an end of the piston rod 10, as shown in FIG. 2A. A copper washer 30 is positioned adjacent the end of the rod 10, as shown in FIG. 2A.

The apparatus 100 comprises means for transmitting temperature data collected by the temperature sensing devices. The apparatus 100 can include a microcontroller operatively connected to a radiofrequency (RF) transmitter 3. The RF transmitter and microcontroller can be contained within a housing 2 that is positioned at the end of the rod 10 that remains outside of the damper column 20, as shown in FIG. 1.

The thermocouple 11 is electrically connected to the microcontroller with RF transmitter 3, and the RF transmitter 3 can transmit temperature data from the thermocouple 11 to a receiving device. The thermocouple 11 can be connected to the RF transmitter via thermocouple wire 19 that extends inside the piston rod 10. One end of the thermocouple wire 19 is connected to the thermocouple connection terminal 11 and the opposite end is connected to the RF transmitter. Temperature data generated by the thermocouple 11 is transmitted to the RF transmitter. The RF transmitter can be operatively connected to a receiving device such as a computer, smart phone and/or smart watch, and can send temperature data collected by the thermocouple 11 to the receiving device.

The apparatus 100 can perform on-board computing and/or transfer the computed data via wireless network hub to a notification node.

The apparatus 100 can include one or more external temperature sensors. The apparatus 100 can include a pair of external thermocouples 31, 32 positioned outside of the damper column 20. A first external thermocouple connection terminal 31 can be attached to a thermocouple mount 41 attached to the exterior surface of the damper column 20 proximate the proximal end 21 of the column 20, as shown in FIG. 1. Thermocouple wires 33 are connected to the thermocouple connection terminal 31. A second external thermocouple connection terminal 32 can be attached to a thermocouple mount 42 attached to the exterior surface of the damper column 20 proximate the distal end 22 of the column 20, as shown in FIG. 1. Thermocouple wires 34 are connected to the thermocouple connection terminal 32. Thermocouples 31, 32 are operatively connected to the RF transmitter 3 such that temperature data collected by the thermocouples 31, 32 is transmitted by the RF transmitter 3 to a receiving device such as a computer, smart phone and/or smart watch.

The apparatus 100 can also include sensors adapted to collect data other than temperature. The apparatus 100 can include a position/motion sensor, such as a microelectromechanical (MEM) sensor 18.

As shown in FIG. 1, the apparatus 100 can include a damper spacer 7 positioned within the damper column 20. The damper spacer 7 holds a magnetorestrictive device that measures displacement distance of the rod 10. The apparatus 100 includes a time measuring device such as a digital watch that can be housed within the RF transmitter housing 2. The velocity of the piston 10 can be calculated using the displacement data collected by the magnetorestrictive device and the time measurement data.

The apparatus 100 can include a sensor for measuring acceleration of the piston rod 10, such as an accelerometer. The accelerometer can be positioned at an end fitting of the apparatus 100.

Spherical attachment members 51, 52 can be positioned at opposite ends of the apparatus 100, as shown in FIG. 1. One attachment member 51 can be attached to the end of the rod 10 external to the damper column 20, and the other attachment member 52 can be attached at the distal end 22 of the column 20. The MEM sensor 18 can be positioned at the distal end 22 of the column 20 on the attachment member 52, as shown in FIGS. 1 and 3.

Figure 4:
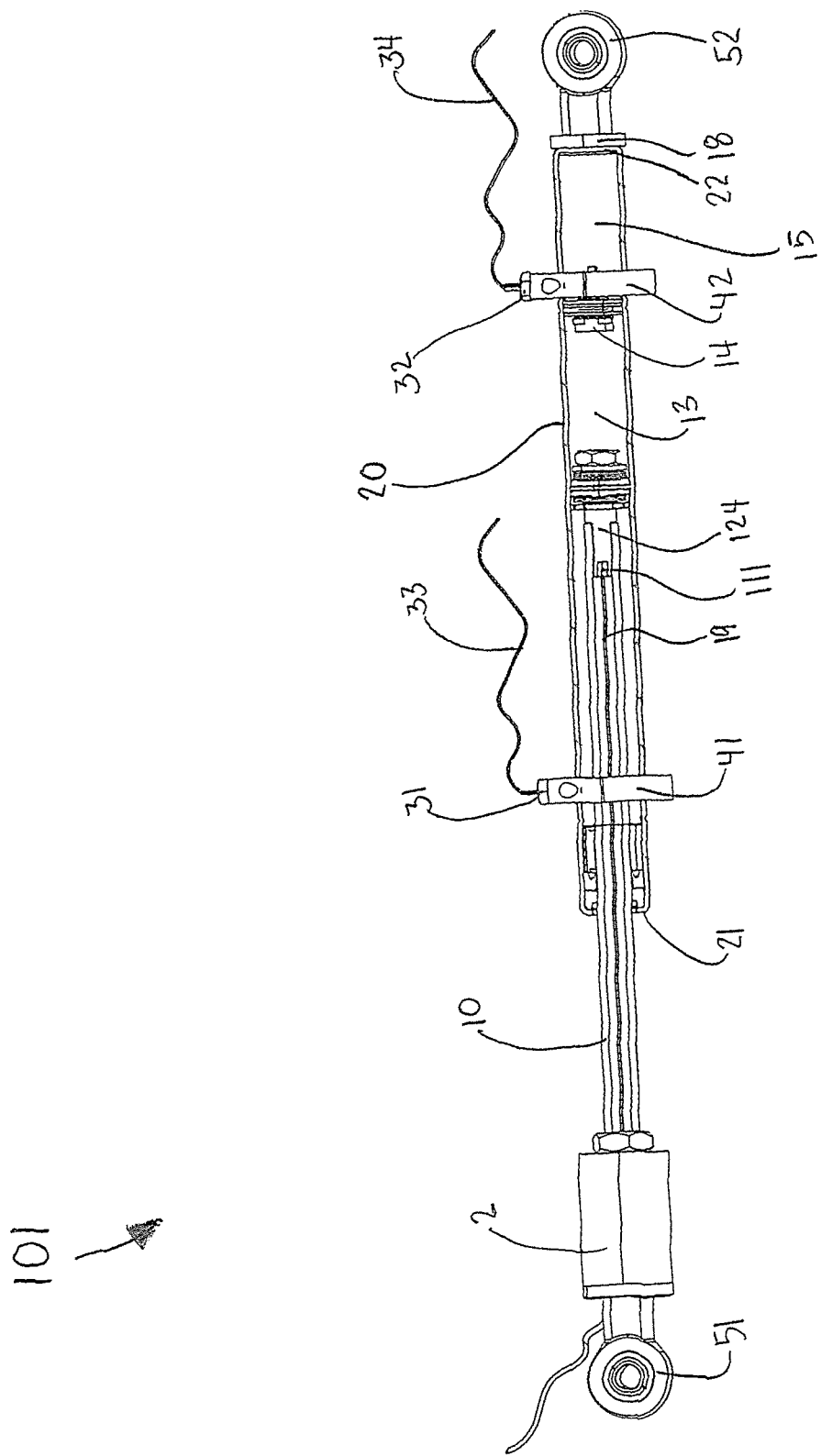
FIG. 4 is a partially cross-sectioned perspective view of a damping apparatus according to another embodiment of the invention.

A damping apparatus according to an alternative embodiment of the invention is illustrated in FIG. 4 and shown generally at reference numeral 101. The damping apparatus 101 is identical to the previously described damping apparatus 100, except with regard to the internal temperature sensor 111. The damping apparatus 101 comprises an internal connection stud 124 in which the thermocouple 111 is positioned, as shown in FIG. 4. By reducing the number of parts, the damping apparatus 101 can generally be made at a lower cost than damping apparatus 100.

According to an embodiment of the invention, the damping apparatus 100 can be used with a solar panel array. Various speeds of the wind (wind buffeting) can start a harmonic motion in the panels of a solar array causing detrimental loads. The damping apparatus 100 dissipates the kinetic energy from the harmonic motion in the panels by converting the kinetic energy into heat. This heat load over time can deteriorate the life of the damping apparatus 100.

The attachment members 51, 52 can be used to attach the damping apparatus 100 to a solar tracking array. Attachment member 52 can be attached to a rotating member, such as a shaft, beam or tube, that is mounted to the panels of the solar tracking array. Attachment member 51 can be attached to a fixed structure of the solar tracking array. Rotational movement of the rotating member connected to the solar panels extends or compresses the damper 100. Under slow rotation when the tracker is being positioned by a motor drive, the damper 100 has little resistance. As the wind creates pressure that acts on the surface area of the panels to induce rotation motion, the extension/compression of the damper 100 increases as does its resistance with the velocity. This resistance prevents the wind from creating harmonic motion in the solar panel array that could generate destructive forces.

The damping apparatus 100 can include means for collecting data regarding environmental conditions, such as weather conditions. The apparatus 100 can include sensors for detecting wind speed, wind direction, ambient temperature and/or humidity. For example, the apparatus 100 can comprise weather sensors such as wind sensors measuring wind speed and direction. The apparatus 100 can comprise an anemometer and/or barometer. In addition to wind speed information, damping apparatus 100 can determine the degree of the wind speed which is useful in decision making regarding whether to stow the tracker in the clockwise or anti-clockwise direction. In another embodiment, the microcontroller of the apparatus 100 can receive weather information from a local weather station.

Heat sources for the damper 100 include the piston 12, bottom valve 14 and the main seal 6. The piston 12 restricts the oil flow creating resistance and heat in the damper 100. The bottom valve 14 restricts oil flow in the compressing direction. The main seal 6 develops heat through friction of the seal lips and surface of the rod 10. The piston 12 is the greatest heat source.

Heat and time can cause failure of the damper 100 through deterioration of the main seal 6. The main seal 6 is important for the operation of the damper 100 by keeping the oil in the cylinder 20. The heat affects the oil by breaking down the viscosity and reducing dampening. The bottom valve 14 can sustain heat related failure. Without the bottom valve 14, the damper 100 loses dampening in the compressing direction.

When the damper 100 is new it has a dampening rate that generates a certain amount of heat with given velocity inputs. As the damper 100 ages and deteriorates the input velocity can remain constant, but the heat load is reduced. This heat load reduction can be attributed to weakening of the damper 100.

Using the data collected from its sensors, the damping apparatus 100 can monitor the solar tracking array for harmful harmonic motion due to wind. Current solar arrays have a wind speed detector at each site, and when the wind speed is over thirty-five miles per hour the trackers move the solar panels to a stow position of 30° or 60° into the wind to prevent damage due to harmonic motion. However, the panels are most effective at creating electricity when they are perpendicular to the sun's rays.

The damping apparatus 100 can actively monitor each array for movement. If the movement is above a certain threshold, a solar array controller instructs the array to move a small amount of degrees. This may or may not be enough to break the wind creating a harmonic motion. If it is sufficient to break the harmonic motion, then the panel is not in the ideal position but can still generate electricity. The damping apparatus 100 sends instructions to the solar array controller to keep moving the panel until the harmful harmonic motion is stopped.

In a high wind event, the damping apparatus 100 can instruct individual rows to go into stow but not those rows that are somehow shielded from the harmonic effects of the wind, thereby maximizing energy generation. With the ability of the damping apparatus 100 to determine energy input by the motion of the row it can be compared to surrounding dampers and determine a failure of one of the dampers and notify that it needs a replacement.

The data acquisition system used in the damping apparatus 100 is extremely sensitive and can sample approximately 120 or more data points from the internal thermocouple 11 in one minute and it can be calibrated to a maximum of approximately 100,000 data points in one minute.

Figure 5:
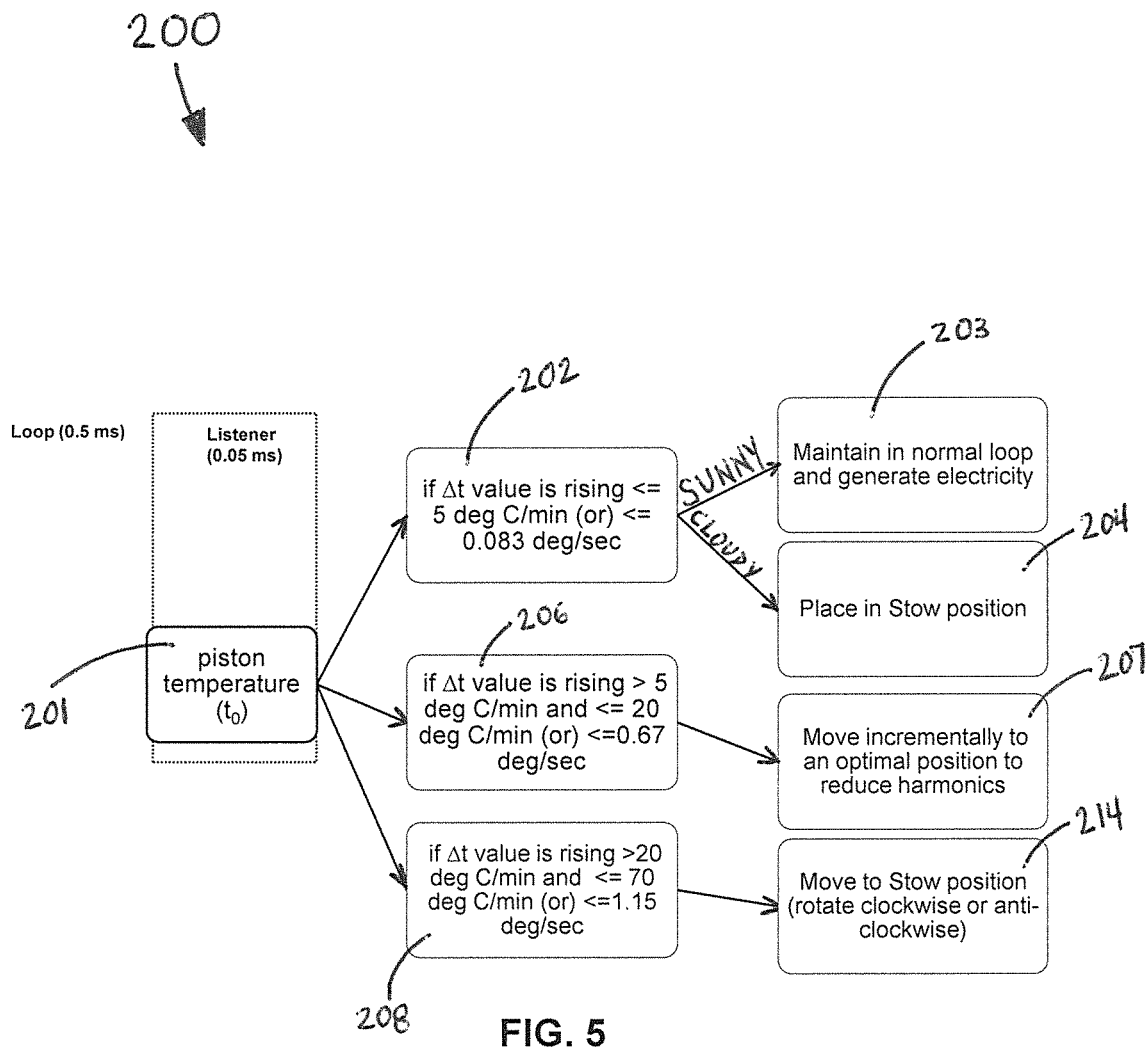
FIG. 5 is an illustration of a method according to an embodiment of the invention.

Using data collected from the interior thermocouple 11, the damping apparatus 100 can calculate the change in temperature per time, such as degrees Celsius per minute (referred to herein as delta T). Alternatively, delta T can be calculated using data from the interior thermocouple 11 and exterior thermocouples 31, 32. Delta T can be used for defining the stow position/optimal position for reduced harmonics, as illustrated in FIG. 5. Heat dissipation for the piston mounted thermocouple 11 is lower compared to the thermocouples 31, 32 mounted on the exterior wall of the cylinder 20.

The delta T rise per minute value ($\Delta T$) can be calculated as follows:

$\Delta T = T_d - T_a$ wherein $T_d$ represents the average real time temperature in the damping apparatus 100 based on 120 sensor samples from the internal temperature sensor 11 per minute, and $T_a$ represents the average real time ambient temperature based on 120 sensor samples from the external temperature sensors 31, 32 per minute.

$T_d$ can be calculated as follows:

$$T_d = \frac{1}{n}\sum_{k=0}^{n=120} T_k$$

$T_a$ can be calculated as follows:

$$T_a = \frac{1}{n}\sum_{i=0}^{n=120} T_i$$

According to an embodiment of the invention, the damping apparatus 100 comprises a computing device comprising a computer processor and a non-transitory computer readable storage medium comprising software having programming instructions that, when executed, cause the processor to carry out the above calculations for $\Delta T$.

The microcontroller of the damping apparatus 100 can be programmed with a variety of algorithms for analyzing data received in the microcontroller from the sensors of the apparatus 100. For example, the apparatus 100 can include a temperature sensing algorithm that can detect when oil in the damper is heated repeatedly, causing changes in properties like viscosity and potentially leading the oil to undergo a series of chemical reactions such as oxidation, hydrolysis and/or polymerization.

The damper temperature sensing algorithm can be customized through empirical simulation modeling in addition to field learning adaptation for optimal interpretation of kinematic inputs to the change in heat. The algorithms can be executed within a computing system, such as an edge computer, a microcontroller, or a cloud computer. The algorithms use key data points such as damper temperature, weather conditions such as ambient temperature, wind speed, wind gust, direction of wind breeze, sky status, humidity for making decisions in protection of the tracker unit and end of life prediction of the damper.

A temperature sensing algorithm according to an embodiment of the invention computes a delta temperature calculation from the data collected from the damper temperature and ambient temperature every 0.5 milliseconds. The algorithm averages the data points collected from these two variables to determine the rise in temperature every minute.

Prediction of harmonics and stow position is based on the data points collected and delta T/time (minutes/seconds). The calculation of the delta Temperature within the computing system can be executed in a perpetual loop to ensure that the system is able to make correct decisions.

A temperature sensing algorithm according to a preferred embodiment of the invention is illustrated in FIG. 5 at reference numeral 200. According to an embodiment of the invention, a computing device comprises a computer processor and a non-transitory computer readable storage medium comprising software comprising the algorithm illustrated in FIG. 5. The software has programming instructions that, when executed, cause the processor to carry out the decision tree illustrated in FIG. 5.

The internal thermocouple 11 can provide the temperature of the piston 12 at a particular time ($t_0$). The temperature of the piston 12 after a certain duration of time ($t_n$) can be measured by the thermocouple 11, and the delta temperature ($\Delta T$) can be calculated from $t_0$ and $t_n$. Preferably, the temperature of the piston 12 is measured in a continuous loop every 0.5 milliseconds (ms), wherein $t_n$ is 0.5 milliseconds after $t_0$, and $t_{n+1}$ is 1.0 ms after $t_0$. Based on the flow logic within the listener loop, the position of the tracker/solar panels is computed. If the tracker is moved incrementally to an optimal position, the temperature value of $t_{n+1}$ is compared with $t_n$. If there is a rise in temperature from $t_n$ to $t_{n+1}$, then the tracker/panel is moved incrementally. If there is a decrease in temperature from $t_n$ to $t_{n+1}$, then the position of the tracker/panel is maintained until the next $t_{n+1}$ value is collected. If there is no change in temperature from $t_n$ to $t_{n+1}$, then the tracker/panel is moved incrementally in a direction to follow the sun and wait for the next $t_{n+1}$ value. The decision on positioning in the stow condition or optimal position can be communicated to the tracker using a Modbus TCP communication protocol or any other network communication protocol.

As show in FIG. 5, in the first step 201 of the algorithm 200, an initial temperature to of the piston 12 is measured by the internal thermocouple 11. A subsequent temperature $t_n$ can be measured 0.5 milliseconds (ms) later. If the $\Delta T$ value is an increase of less than or equal to five degrees Celsius (C) per minute (min) (or less than or equal to 0.083 degrees Celsius per second) 202 and weather conditions are clear/sunny, then the tracker/solar panels are maintained in the normal loop to generate electricity 203. If the $\Delta T$ value is rising less than or equal to five degrees Celsius per minute (or less than or equal to 0.083 degrees per second) 202 and it is cloudy, then the panels can be moved to the stow position 204. It has been determined that when $\Delta T$ is an increase of less than or equal to five degrees Celsius (C) per minute (min) (or less than or equal to 0.083 degrees Celsius per second), then the speed of the piston 12 is less than or equal to fifty millimeters (mm) per second (sec). At these conditions, there are no identified harmonics and therefore the damping apparatus 100 does not need to provide instructions to the tracker for moving the position of the panel(s) to minimize harmonics. If the $\Delta T$ value is an increase of greater than five degrees Celsius per minute and less than or equal to twenty degrees Celsius per minute (or greater than 0.083 degrees Celsius per second (sec) and less than or equal to 0.67 degrees Celsius per second) 206, then the damping apparatus 100 sends a signal instructing the tracker to move the solar panels incrementally to an optimal position to reduce harmonics and maximize solar energy harvesting 207. The tracker determines the optimal position for the solar panel(s) and moves the panel(s) accordingly. At these temperature conditions 206, harmonics are identified and the piston 12 is moving at a speed of greater than fifty millimeters (mm) per second (sec) and less than or equal to 125 mm/sec. If the $\Delta T$ value is an increase of greater than twenty degrees Celsius per minute and less than or equal to seventy degrees Celsius per minute (or 1.15 degrees Celsius per second) 208, then the damping apparatus 100 instructs the tracker to move the panel(s) to stow position 214. This can be done by rotating the panel(s) clockwise or counter-clockwise.

It has been determined that a piston speed of 100 mm/sec can be critical, because it provides the maximum sustainable temperature for the damper 100 when it reaches heat in=heat out equilibrium. Piston speeds above 100 mm/sec are likely to result in failure of the damper 100 over time.

Figure 6:
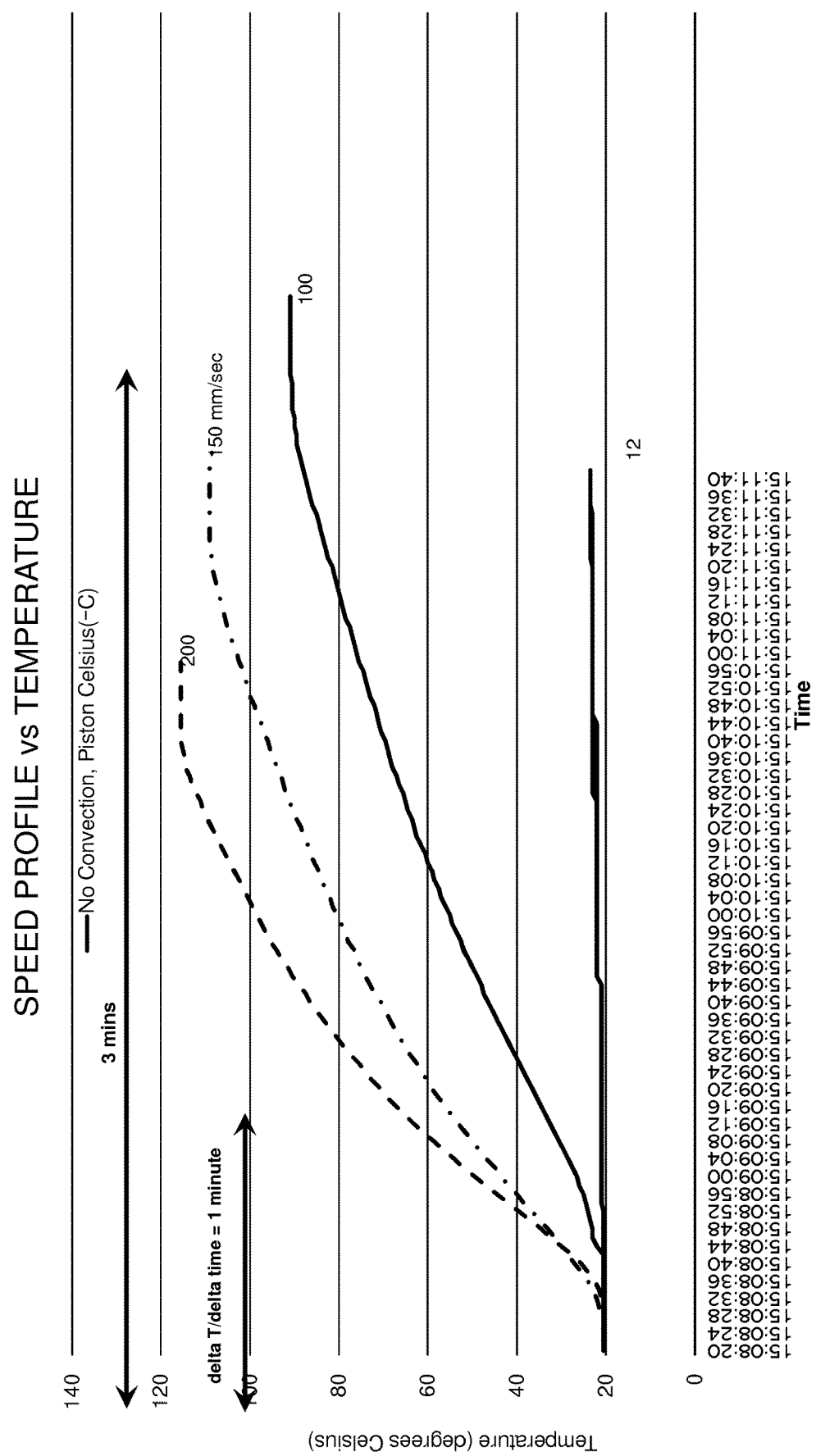
FIG. 6 is a schematic illustration of a method according to another embodiment of the invention.

The relationship between the speed of the piston 12 and damper temperature is illustrated in FIG. 6. The relationship between speed and delta T is shown in the Table A below.

TABLE A

| # | Speed (mm/sec) | Condition | Delta T/min (spike) | Delta T/min (120 sec) | Average Delta T/sec (180 sec) |
|---|---|---|---|---|---|
| 1 | 12 | 0 Convection | 1 | 1.12 | 0.008 |
| 2 | 12 | 7.5 mph | 1 | 1.1 | 0.008 |
| 3 | 12 | 18 mph | 1 | 1.1 | 0.007 |
| 4 | 12 | 28 mph, −18 deg C. | 0.75 | 1 | 0.006 |
| 5 | 100 | 0 Convection | 16 | 42.5 | 0.38 |
| 6 | 100 | 7.5 mph | 15.5 | 39 | 0.32 |
| 7 | 100 | 18 mph | 16 | 38.5 | 0.31 |
| 8 | 100 | 28 mph, −18 deg C. | 15.5 | 33.5 | 0.24 |
| 9 | 150 | 0 Convection | 34 | 68.5 | 0.62 |
| 10 | 150 | 7.5 mph | 38.5 | 68 | 0.52 |
| 11 | 150 | 18 mph | 35 | 64.5 | 0.47 |
| 12 | 150 | 28 mph, −18 deg C. | 35 | 56 | 0.36 |
| 13 | 200 | 0 Convection | 55 | 89 | 0.99 |
| 14 | 200 | 7.5 mph | 50 | 89.5 | 0.88 |
| 15 | 200 | 18 mph | 44.5 | 85 | 0.80 |
| 16 | 200 | 28 mph, −18 deg C. | 46 | 74.5 | 0.5 |

The delta T value of the system can be calibrated and changed to suit the tracker application for which it is installed. For example, the delta T stow position for a tracker application can be ten degrees Celsius per minute and for another tracker application it could be seven degrees Celsius per minute or twenty degrees Celsius per minute. Hence, the system can be tuned to change the conditional values of delta T suited for a tracker application. The algorithms for determining the ideal position of the solar array or the stow position can be customized for a particular solar field. If the equipment or damper setup in a certain field creates changes in the mechanical function of the damper, the algorithm (delta T) can be changed to accommodate the changes.

The algorithm platform can have pluggable components and interfaces for expansion of the sensor technology. For example, the system can perform protection of the tracker unit and/or failure detection using another sensing technology such as accelerometer, pressure sensor, linear position sensor, hall counts sensor, string potentiometer, and/or LVDT.

The computing system can connect to the local weather station and/or site weather station to get the information pertaining to the wind speed, ambient temperature, and/or humidity.

The system can have preconfigured historical data patterns for a damper which has been sized for an application. This information can be stored in a database installed within a computing device. The system can have machine learning algorithms deployed within the computing device which perform deep learning of the damping apparatus 100 during its operation. The machine learning algorithms can study anomalies, outlier conditions and predict outcome by comparing the real time data with the patterns from the historical model. Deviations from the predicted outcome can be notified to the operators which provide additional information on the possibility of faults or failures in the damping apparatus 100 which may or may not have been identified at the time of system installation.

The algorithms can be integrated into software that can be downloaded into the microcontroller of the apparatus 100. Platform updates for the ground station software can be flashed from the cloud using over-the-air (OTA) protocol. An over-the-air update can be a software update that is distributed over Wi-Fi or mobile broadband using a function built into the operating system, with the "over-the-air" aspect referring to its use of wireless Internet rather than requiring the user to connect the device to a computer via USB to perform the update. Firmware updates to the damper can be available for download from the OTA service. This can be used to upload any software updates or software patch to the customer location. The system can employ different OTA technologies, such as GSM and ZigBee, for flashing the software over the air.

Figure 7:
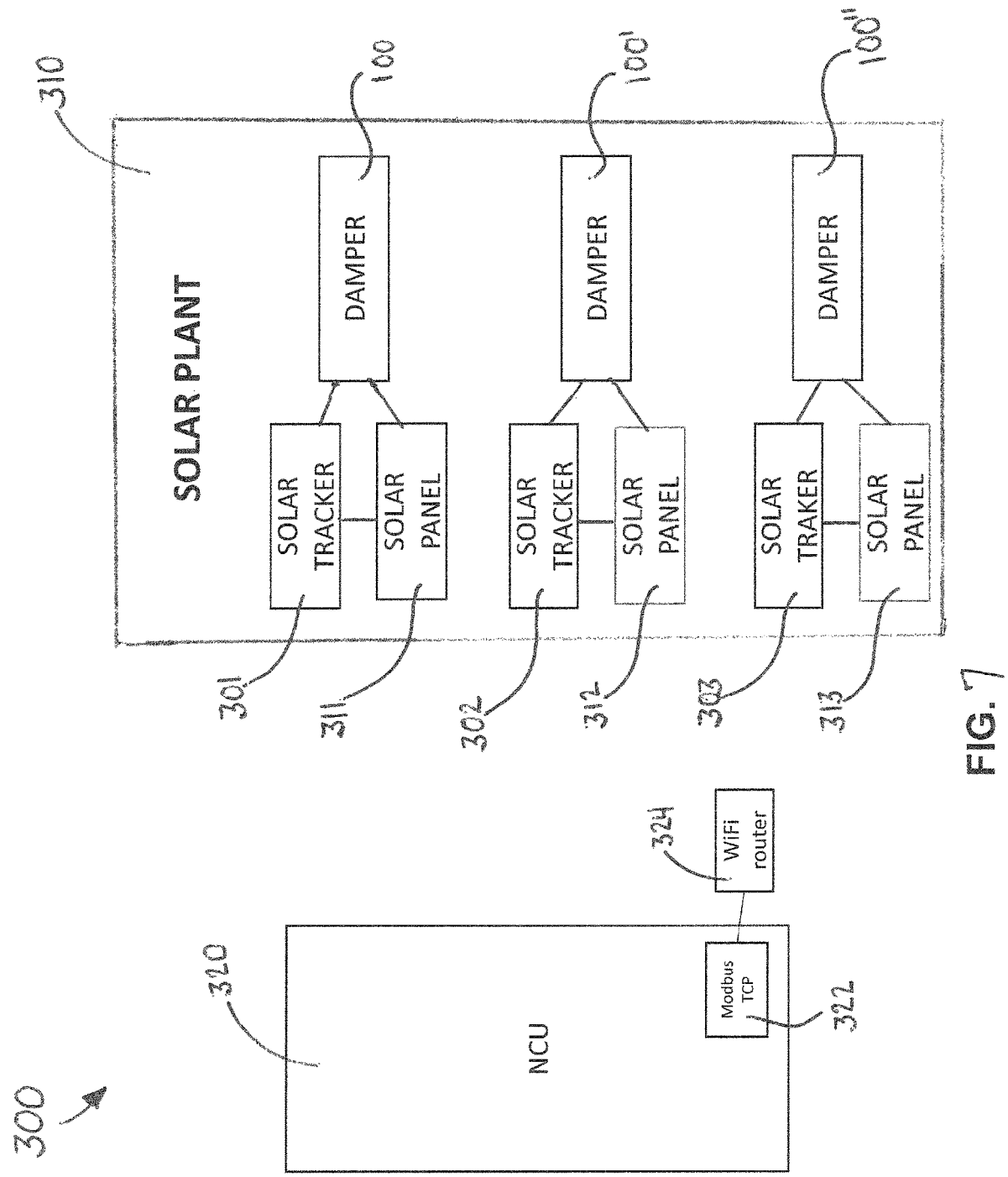
FIG. 7 is a schematic illustration of a system according to another embodiment of the invention.

A shown in FIG. 7, an embodiment of the invention comprises a system 300 comprising a solar plant 310 operatively connected to a network controller unit 320. The solar plant 310 comprises a plurality of solar tacking devices 301, 302, 303 operatively connected to solar panels 311, 312, 313, respectively. The solar plant 300 includes a plurality of like damping apparatuses 100, 100', 100". Each damping apparatus 100, 100', 100" is operatively connected to a solar panel 311, 312, 313, respectively. The network controller unit 320 is adapted to run Modbus transmission control protocol (TCP) or other suitable communication protocol 322, and is operatively connected to a wireless internet (WiFi) router 324. Each solar tracker 301, 302, 303 is assigned a corresponding unique address in Modbus TCP. The network controller unit 310 can communicate with the solar tracking devices 301, 302, 303 and the damping apparatuses 100, 100', 100" via the wireless (WiFi) router 324.

The solar plant 310 is controlled by the network controller unit 320 which sends information to each solar tracker 301, 302, 303 regarding the angle and position the tracker should be defined to optimize energy production. Each damper 100, 100', 100" is operatively connected to a solar tracking device 301, 302, 303 and its corresponding solar panel 311, 312, 313. Each damper 100, 100', 100" collects information on the delta Temperature over time, and verifies for any harmonic events. If a harmonic event is identified, the tracker 301, 302, 303 that is related to the harmonic event will query the network control unit 320 to obtain information from the tracker 301, 302, 303, such as the position/angle of the corresponding solar panel 311, 312, 313, and send an updated signal to the network control unit 320. The network control unit 320 can process data from the tracker 301, 302, 303 and damper 100, 100', 100", and sends updated position instructions to the tracker 301, 302, 303 to move the position/angle of the solar panel 311, 312, 313 to a position that maximizes solar energy harvesting.

Figure 8:
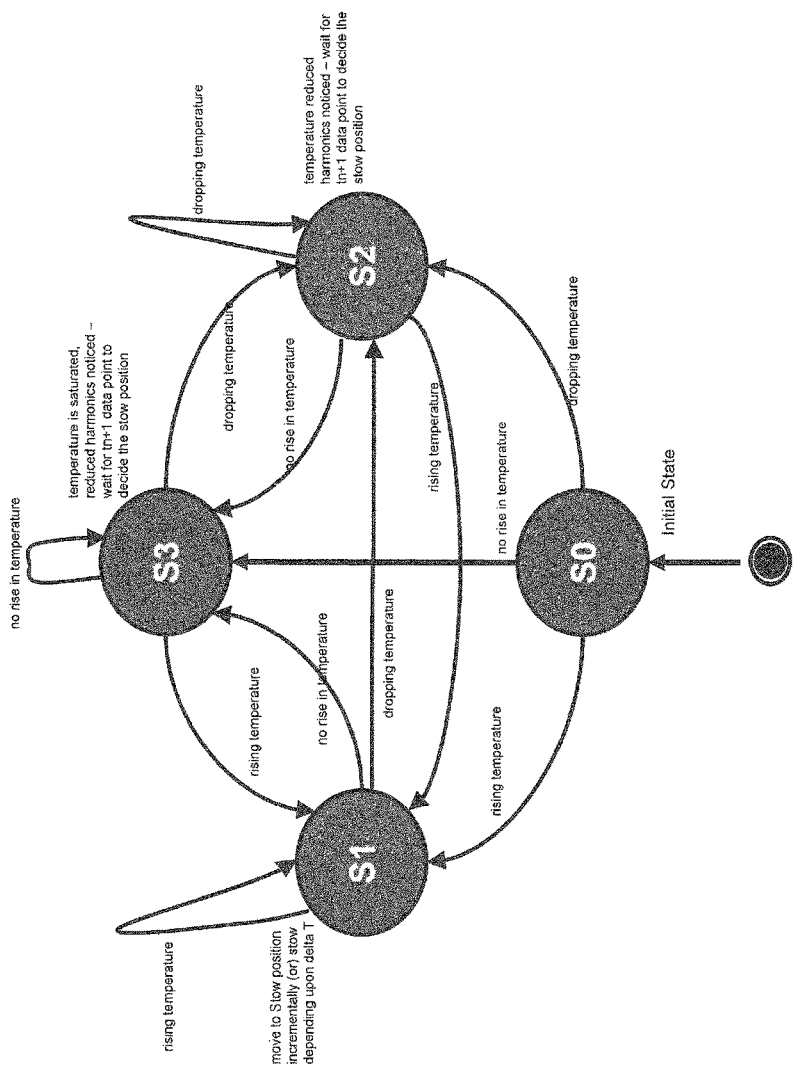
FIG. 8 is a schematic illustration of a method according to another embodiment of the invention.
Figure 9:
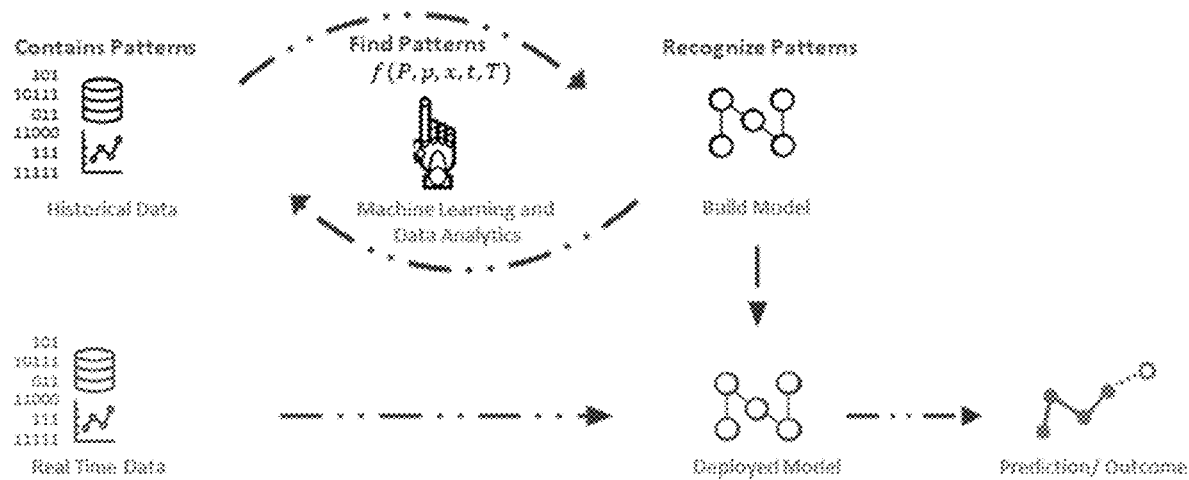
FIG. 9 is a schematic illustration of a system according to another embodiment of the invention.

A method of operating solar panels to maximize solar energy collection according to an embodiment of the invention is illustrated in FIG. 8. Delta T is used to make the decision as to whether to move the solar panels to stow position.

A beneficial feature of the damping apparatus 100 is that it reduces the frequency of solar panels being moved to the stow position when it is not actually necessary to do so, known as "false stow position." The slew drive on some solar trackers is powered by a battery that is charged by its own solar panel, independent of the grid. The tracker system may get a false stow command during the day and run the trackers to a stow position, and then have to run back to the operating position. The slew drive batteries have limited stored energy and can readily run out of the necessary energy to return the tracker leaving the panels stranded until it recharges. The damping apparatus 100 can prevent this by minimizing instances in which panels are unnecessarily moved to stow position (false stow).

While the damping apparatus 100 is used with a solar panel array in accordance with various embodiments of the invention described above, the apparatus 100 can be used in other applications. For example, the damping apparatus 100 can be used with agricultural equipment, such as an agricultural spray boom or harvester deck. The apparatus can be used to adjust the position of an agricultural spray boom arm or harvester deck for precise application or harvesting depth.

A damping apparatus and method of using same are described above. Various changes can be made to the invention without departing from its scope. The above description of various embodiments of the invention are provided for the purpose of illustration only and not limitation—the invention being defined by the claims and equivalents thereof.

What is claimed is:

1. A damping apparatus comprising:
   (a) a housing defining an interior area, the housing having an interior surface and an exterior surface, and a first end and a second end opposite the first end;
   (b) a piston rod partially positioned within the interior area of the housing, the piston rod having first and second opposed ends, the first end of the piston rod residing exterior to the housing and the second end of the piston rod residing within the interior area of the housing, the first end of the housing having an opening formed therein for receiving the piston rod therethrough, the piston rod adapted for moving in an extension stroke wherein the piston rod moves toward the first end of the housing and an extension stroke wherein the piston rod moves toward the second end of the housing;
   (c) a piston positioned proximate the second end of the piston rod; and
   (d) an internal temperature sensor configured to measure temperature inside the damping apparatus;
   (e) a computing device operatively connected to a radiofrequency transmitter, the computing device and the radiofrequency transmitter connected to the piston rod proximate the first end of the piston rod, wherein the internal temperature sensor is operatively connected to the computing device and the radiofrequency transmitter whereby the radiofrequency transmitter can transmit temperature data generated by the internal temperature sensor to a receiving device;
   (f) a magnetorestrictive sensor connected to the piston rod and adapted to measure displacement distance of the piston rod;
   (g) a time measuring device; and
   (h) wherein the magnetorestrictive sensor and the time measuring device are operatively connected to the computing device and the radiofrequency transmitter, the computing device comprising a processor and a non-transitory computer readable storage medium comprising software comprising programming instructions that, when executed, cause the processor to calculate a velocity of the piston using displacement data generated by the magnetorestrictive sensor and time data generated by the time measuring device, and wherein the radiofrequency transmitter can transmit the velocity to a receiving device.

2. The damping apparatus according to claim 1, wherein the piston rod is hollow and defines an interior therein, and the internal temperature sensor is at least partially positioned within the interior of the piston rod, wherein the internal temperature sensor comprises a K-type thermocouple comprising at least one wire positioned within the interior of the piston rod and connected to a connection terminal attached to the piston rod proximate the piston.

3. The damping apparatus according to claim 2, wherein the at least one wire of the K-type thermocouple is connected to the radiofrequency transmitter.

4. The damping apparatus according to claim 1, further comprising a bottom valve positioned within the interior area of the housing intermediate the first end of the housing and the second end of the housing, wherein the interior area intermediate the bottom valve and the first end of the housing define a working chamber and the interior area intermediate the bottom valve and the second end of the housing define a compensating chamber, and further comprising a damping fluid medium disposed within the working chamber, wherein the bottom valve allows at least a portion of the damping fluid disposed within the working chamber to enter the compensating chamber when the piston rod moves in a compression stroke.

5. The damping apparatus according to claim 4, wherein the internal temperature sensor is positioned proximate the bottom valve.

6. The system according to claim 1, wherein the computing device comprises a computer processor and a non-transitory computer readable storage medium comprising software comprising programming instructions that, when executed, cause the processor to analyze the temperature data and send instructions to the receiving device based on the analysis of the data.

7. The damping apparatus according to claim 1, further comprising an external temperature sensor adapted to measure temperature outside the damping apparatus, the external temperature sensor attached to the exterior surface of the housing and operatively connected to the computing device and the radiofrequency transmitter whereby the radiofrequency can transmit temperature data generated by the external temperature sensor to a receiving device.

8. The damping apparatus according to claim 1, further comprising a position sensor connected to the piston rod and adapted to generate position data regarding position of the piston rod, the position sensor operatively connected to the computing device and the radiofrequency transmitter whereby the radiofrequency transmitter can transmit the position data generated by the position sensor to a receiving device.

9. The damping apparatus according to claim 1, further comprising a sensor adapted to measure acceleration of the piston rod, the sensor operatively connected to the computing device and the radiofrequency transmitter whereby the radiofrequency transmitter can transmit acceleration data generated by the sensor to a receiving device.

10. The damping apparatus according to claim 1, further comprising at least one weather sensor adapted to generate data relating to at least one of wind speed and wind direction, the at least one weather sensor operatively connected to the computing device and the radiofrequency transmitter whereby the radiofrequency transmitter can transmit data generated by the at least one weather sensor to a receiving device.

11. A system for harvesting solar energy comprising:
(a) a solar panel array comprising at least one solar panel adapted to absorb solar energy for generating electricity;
(b) a solar tracking device operatively connected to the solar panel array and adapted to position the at least one solar panel in a plurality of positions;
(c) a damping apparatus operatively connected to the at least one solar panel, the damping apparatus adapted to absorb kinetic energy from movement of the at least one solar panel and convert the kinetic energy to heat energy, the damping apparatus comprising a computing device operatively connected to the solar tracking device to communicate with the solar tracking device, the damping apparatus further comprising a temperature sensor adapted for measuring temperature inside the damping apparatus and sending data relating to the temperature inside the damping apparatus to the computing device, wherein the computing device analyzes the data, and sends instructions to the solar tracking device for adjusting the position of the at least one solar panel based on the analysis of the data, the computing device comprising a computer processor and a non-transitory computer readable storage medium comprising software comprising programming instructions that, when executed, cause the processor to analyze the data and send instructions to the solar tracking device for adjusting the position of the at least one solar panel based on the analysis of the data; and
(d) wherein the damping apparatus takes an initial measurement of the heat energy and at least one subsequent measurement of the heat energy after a predetermined amount of time whereby a delta temperature value is determined by subtracting the initial measurement of heat energy from the at least one subsequent measurement of the heat energy, and the instructions to the solar tracking device for adjusting the position of the solar panel are based on analysis of the delta temperature value.

12. The system according to claim 11, wherein the damping apparatus comprises:
(a) a housing defining an interior area, the housing having an interior surface and an exterior surface, and a first end and a second end opposite the first end;
(b) a piston rod partially positioned within the interior area of the housing, the piston rod having first and second opposed ends, the first end of the piston rod residing exterior to the housing and the second end of the piston rod residing within the interior area of the housing, the first end of the housing having an opening formed therein for receiving the piston rod therethrough, the piston rod adapted for moving in an extension stroke wherein the piston rod moves toward the first end of the housing and an extension stroke wherein the piston rod moves toward the second end of the housing;
(c) a piston positioned proximate the second end of the piston rod; and
(d) wherein the temperature sensor is positioned within the interior area of the housing.

13. The system according to claim 12, wherein the piston rod is hollow and defines an interior therein, and the internal temperature sensor is at least partially positioned within the interior of the piston rod.

14. The damping apparatus according to claim 11, wherein if the delta temperature value is an increase of greater than five degrees Celsius per minute and less than or equal to twenty degrees Celsius per minute, then the damping apparatus provides instructions to the solar tracking device to move the panels incrementally to an optimal position to reduce wind harmonics on the solar panel and maximize solar energy harvesting, and further wherein if the delta temperature value is an increase of greater than twenty degrees Celsius per minute, then the damping apparatus instructs the solar tracking device to move the solar panel to a stow position.

15. The system according to claim 11, wherein the computing device comprises a network controller unit adapted to run Modbus transmission control protocol, the network controller unit operatively connected to a wireless internet router whereby the network controller unit communicates with the solar tracking device.

16. The system according to claim 11, wherein if the delta temperature value is an increase of greater than five degrees Celsius per minute and less than or equal to twenty degrees Celsius per minute, then the damping apparatus provides instructions to the solar tracking device to move the panels incrementally to an optimal position to reduce wind harmonics on the solar panel and maximize solar energy harvesting, and wherein if the delta temperature value is an increase of greater than twenty degrees Celsius per minute, then the damping apparatus instructs the solar tracking device to move the at least one solar panel to a stow position, and wherein if the delta temperature value is an increase of less than or equal to five degrees Celsius per minute, then the damping apparatus sends no instructions to the solar tracking device to move the at least one solar panel.

17. A damping apparatus for use with a solar panel and a solar tracking device operatively connected to the solar panel to control positioning of the solar panel, the damping apparatus adapted to absorb kinetic energy from movement of the solar panel and convert the kinetic energy to heat energy inside the damping apparatus, the damping apparatus comprising means for measuring the heat energy inside the damping apparatus, collecting data relating to the measuring of the heat energy, analyzing the data, and sending instructions to the solar tracking device for adjusting the position of the solar panel based on the analysis of the data; wherein the damping apparatus takes an initial measurement of the heat energy and at least one subsequent measurement of the heat energy after a predetermined amount of time whereby a delta temperature value can be determined by subtracting the initial measurement of heat energy from the at least one subsequent measurement of the heat energy, and the instructions to the solar tracking device for adjusting the position of the solar panel are based on analysis of the delta temperature value; and further wherein if the delta temperature value is an increase of greater than five degrees Celsius per minute and less than or equal to twenty degrees Celsius per minute, then the damping apparatus provides instructions to the solar tracking device to move the panels incrementally to an optimal position to reduce wind harmonics on the solar panel and maximize solar energy harvesting, and further wherein if the delta temperature value is an increase of greater than twenty degrees Celsius per minute, then the damping apparatus instructs the solar tracking device to move the solar panel to a stow position.

18. The damping apparatus according to claim 1, wherein the damping apparatus comprises a computing device comprising a computer processor and a non-transitory computer readable storage medium comprising software comprising programming instructions that, when executed, cause the processor to analyze the data and send instructions to the solar tracking device for adjusting the position of the solar panel based on the analysis of the data.

* * * * *